United States Patent
Cheng et al.

(10) Patent No.: US 8,946,060 B2
(45) Date of Patent: Feb. 3, 2015

(54) METHODS OF MANUFACTURING STRAINED SEMICONDUCTOR DEVICES WITH FACETS

(71) Applicant: Taiwan Semiconductor Manufacturing Company, Ltd., Hsinchu (TW)

(72) Inventors: Yu-Hung Cheng, Hsinchu (TW); Chii-Horng Li, Jhu-Bei (TW); Tze-Liang Lee, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/889,846

(22) Filed: May 8, 2013

(65) Prior Publication Data
US 2013/0244389 A1     Sep. 19, 2013

Related U.S. Application Data

(62) Division of application No. 12/984,877, filed on Jan. 5, 2011, now Pat. No. 8,455,930.

(51) Int. Cl.
*H01L 21/20* (2006.01)
*H01L 21/36* (2006.01)
(Continued)

(52) U.S. Cl.
CPC .. *H01L 29/66636* (2013.01); *H01L 21/823412* (2013.01); *H01L 21/823418* (2013.01);
(Continued)

(58) Field of Classification Search
CPC ............. H01L 21/02532; H01L 29/7848; H01L 29/66636; H01L 29/66628
USPC ........................... 438/300, 478, 607
See application file for complete search history.

(56) References Cited

U.S. PATENT DOCUMENTS

| 6,402,974 | B1 * | 6/2002 | Trevor et al. ............... 216/67 |
| 7,994,062 | B2 | 8/2011 | Wojtczak et al. |

(Continued)

FOREIGN PATENT DOCUMENTS

| CN | 1543679 | 11/2004 |
| CN | 1797783 | 7/2006 |

(Continued)

OTHER PUBLICATIONS

Pribat, Clement et al., "Si and SiGe Faceting During Selective Epitaxy", Solid-State Electronics, vol. 53, Issue 8, Aug. 2009, 865-868, pages selected from the 4th International SiGe Technology and Device Meeting (ISTDM 2008).

(Continued)

*Primary Examiner* — Jerome Jackson, Jr.
*Assistant Examiner* — Paul Budd
(74) *Attorney, Agent, or Firm* — Lowe Hauptman & Ham, LLP

(57) ABSTRACT

A method for fabricating a semiconductor device, the method includes forming a gate stack over a major surface of a substrate. The method further includes recessing the substrate to form source and drain recess cavities adjacent to the gate stack in the substrate. The method further includes selectively growing a strained material in the source and drain recess cavities in the substrate using an LPCVD process, wherein the LPCVD process is performed at a temperature of about 660 to 700° C. and under a pressure of about 13 to 50 Torr, using $SiH_2Cl_2$, HCl, $GeH_4$, $B_2H_6$, and $H_2$ as reaction gases.

20 Claims, 6 Drawing Sheets

(51) Int. Cl.
  *H01L 29/66*  (2006.01)
  *H01L 21/8234*  (2006.01)
  *H01L 21/8238*  (2006.01)
  *H01L 29/78*  (2006.01)
  *H01L 21/02*  (2006.01)

(52) U.S. Cl.
  CPC  *H01L21/823481* (2013.01); *H01L 21/823807* (2013.01); *H01L 21/823814* (2013.01); *H01L 21/823878* (2013.01); *H01L 29/7848* (2013.01); *H01L 21/0243* (2013.01); *H01L 21/02532* (2013.01); *H01L 21/0262* (2013.01); *H01L 29/78* (2013.01)
  USPC ..... 438/478; 438/300; 438/607; 257/E21.431

(56) References Cited

U.S. PATENT DOCUMENTS

| | | | |
|---|---|---|---|
| 8,236,659 B2 | 8/2012 | Tsai et al. | |
| 2005/0148147 A1* | 7/2005 | Keating et al. | 438/299 |
| 2006/0138398 A1 | 6/2006 | Shimamune et al. | |
| 2006/0202234 A1 | 9/2006 | Hara | |
| 2006/0220153 A1* | 10/2006 | Murthy et al. | 257/408 |
| 2007/0018205 A1 | 1/2007 | Chidambarrao et al. | |
| 2007/0254414 A1* | 11/2007 | Miyanami | 438/149 |
| 2008/0185617 A1* | 8/2008 | Kuan et al. | 257/288 |
| 2008/0237634 A1* | 10/2008 | Dyer et al. | 257/190 |
| 2008/0258180 A1 | 10/2008 | Chen et al. | |
| 2009/0035911 A1* | 2/2009 | Rachmady et al. | 438/300 |
| 2009/0302348 A1* | 12/2009 | Adam et al. | 257/190 |
| 2010/0219474 A1 | 9/2010 | Kronholz et al. | |
| 2011/0042729 A1 | 2/2011 | Chen et al. | |
| 2011/0183481 A1 | 7/2011 | Dyer | |
| 2011/0201164 A1 | 8/2011 | Chung et al. | |
| 2011/0287611 A1* | 11/2011 | Cheng et al. | 438/478 |
| 2012/0001238 A1 | 1/2012 | Tsai et al. | |
| 2012/0074468 A1 | 3/2012 | Yeh et al. | |

FOREIGN PATENT DOCUMENTS

| | | |
|---|---|---|
| CN | 1988110 | 6/2007 |
| TW | 200814319 | 3/2008 |

OTHER PUBLICATIONS

Office Action dated Aug. 28, 2013 from corresponding application No. TW 100115564.

* cited by examiner

US 8,946,060 B2

METHODS OF MANUFACTURING STRAINED SEMICONDUCTOR DEVICES WITH FACETS

CROSS-REFERENCE TO RELATED APPLICATION

The present application is a divisional of U.S. application Ser. No. 12/984,877, filed Jan. 5, 2011, the disclosure of which is incorporated herein by reference in its entirety.

FIELD

The disclosure relates to integrated circuit fabrication, and more particularly to a semiconductor device with a strained structure.

BACKGROUND

When a semiconductor device, such as a metal-oxide-semiconductor field-effect transistor (MOSFET), is scaled down through various technology nodes, high-k gate dielectric layer and metal gate electrode layer are incorporated into the gate stack of the MOSFET to improve device performance with the decreased feature sizes. In addition, strained structures in source and drain (S/D) recess cavities of the MOSFET utilizing selectively grown silicon germanium (SiGe) may be used to enhance carrier mobility.

However, there are challenges to implement such features and processes in complementary metal-oxide-semiconductor (CMOS) fabrication. As the gate length and spacing between devices decrease, these problems are exacerbated. For example, it is difficult to achieve an enhanced carrier mobility for a semiconductor device because strained materials can not deliver a given amount of strain into channel region of the semiconductor device, thereby increasing the likelihood of device instability and/or device failure.

Accordingly, what is needed is an improved method for fabricating a strained structure in a semiconductor device.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

Figure 1:
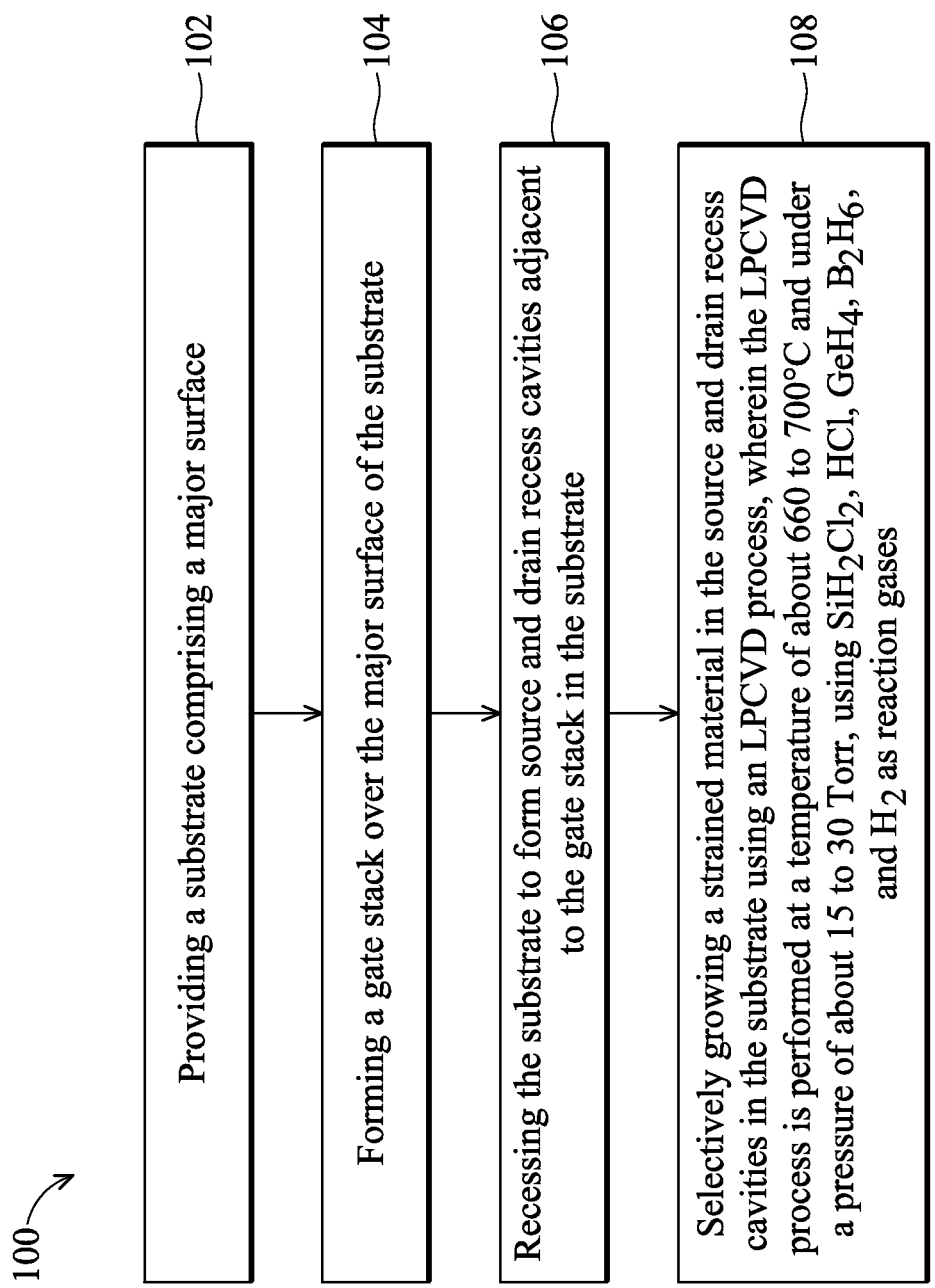
FIG. 1 is a flowchart illustrating a method for fabricating a semiconductor device comprising a strained structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart illustrating a method 100 for fabricating a semiconductor device 200 comprising a strained structure 220 (shown in FIGS. 5A and 5B) according to various aspects of the present disclosure. FIGS. 2-5B show schematic cross-sectional views of a strained structure 220 of a semiconductor device 200 at various stages of fabrication according to an embodiment of the method 100 of FIG. 1. The semiconductor device 200 may be included in a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 5B are simplified for a better understanding of the inventive concepts of the present disclosure. For example, although the figures illustrate the semiconductor device 200, it is understood the IC may comprise a number of other devices comprising resistors, capacitors, inductors, fuses, etc.

Figure 2:
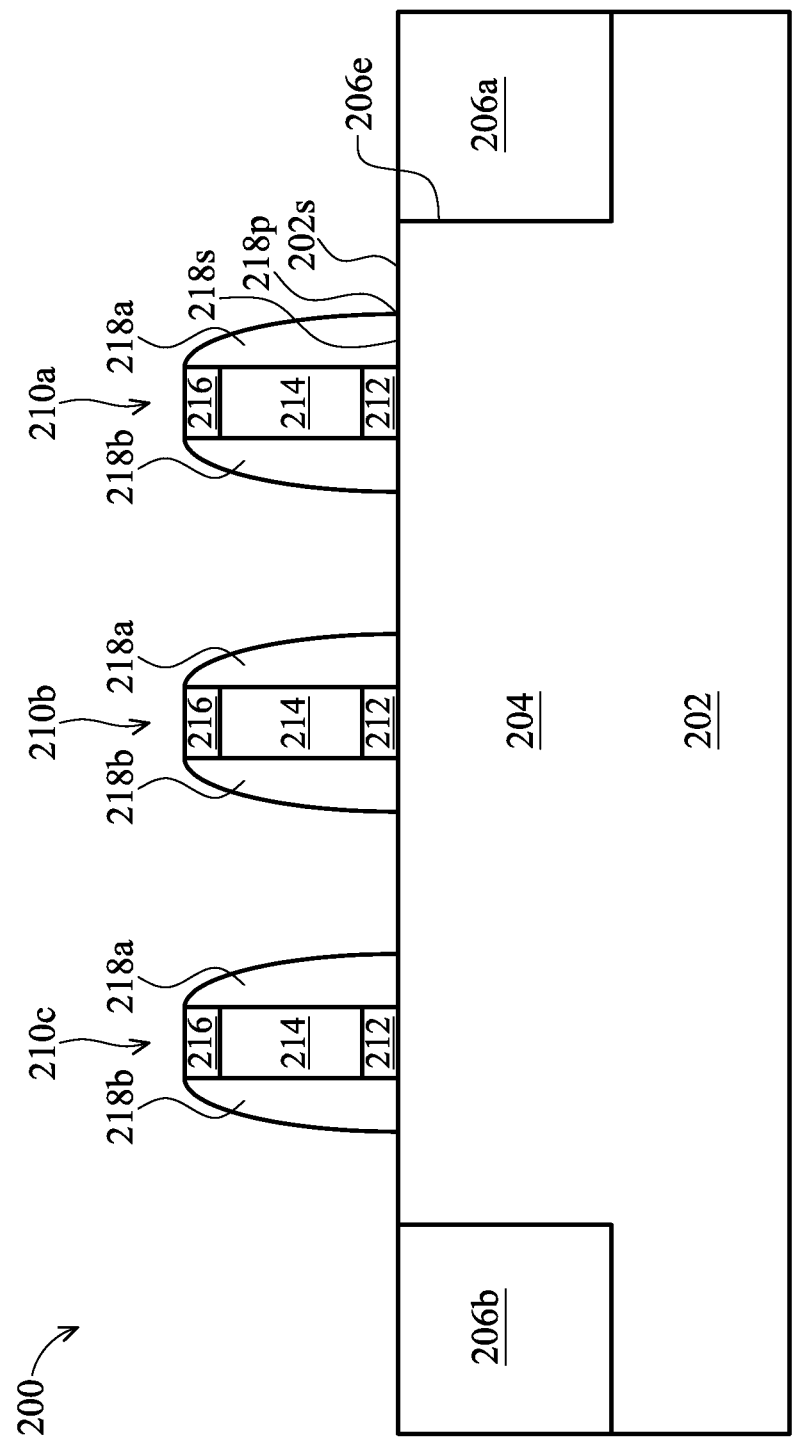
FIGS. 2-5B show schematic cross-sectional views of a strained structure of a semiconductor device at various stages of fabrication according to various aspects of the present disclosure.

Referring to FIGS. 1 and 2, the method 100 begins at step 102 wherein a substrate 202 comprising a major surface 202s is provided. In one embodiment, the substrate 202 comprises a crystalline silicon substrate (e.g., wafer). Further, the substrate 202 may include an epitaxial layer (epi layer), may be strained for performance enhancement, and/or may include a silicon-on-insulator (SOI) structure.

The substrate 202 may further comprise active regions 204. The active regions 204 may include various doping configurations depending on design requirements as known in the art. In some embodiments, the active regions 204 may be doped with p-type or n-type dopants. For example, the active regions 204 may be doped with p-type dopants, such as boron or $BF_2$; n-type dopants, such as phosphorus or arsenic; and/or combinations thereof. The active regions 204 may act as regions configured for a N-type metal-oxide-semiconductor transistor device (referred to as an NMOS) and regions configured for a P-type metal-oxide-semiconductor transistor device (referred to as a PMOS).

Isolation structures 206a, 206b may be formed on the substrate 202 to isolate the various active regions 204. The isolation structures 206a, 206b may utilize isolation technology, such as local oxidation of silicon (LOCOS) or shallow trench isolation (STI), to define and electrically isolate the various active regions 204. In the present embodiment, the isolation structures 206a, 206b include a STI. The isolation structures 206a, 206b may comprise silicon oxide, silicon nitride, silicon oxynitride, fluoride-doped silicate glass (FSG), a low-K dielectric material, other suitable materials, and/or combinations thereof. The isolation structures 206a, 206b, and in the present embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide. The isolation structure 206a in the substrate 202 has the outer edge 206e.

Still referring to FIGS. 1 and 2, the method 100 continues with step 104 in which a gate stack 210a is formed by sequentially depositing and patterning a gate dielectric layer 212 and a gate electrode layer 214 on the substrate 202. The gate stack 210a may be formed using any suitable process, including the processes described herein.

In one example, a blanket gate dielectric layer 212 is formed on the substrate 202. In some embodiments, the gate dielectric layer 212 may be a thin film comprising silicon oxide, silicon nitride, silicon oxy-nitride, high-k dielectrics, and/or other suitable dielectric materials. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 212 is a high-k dielectric layer with a thickness in the range of about 10 to 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and substrate 202. The interfacial layer may comprise silicon oxide.

A blanket gate electrode layer 214 is then formed on the blanket gate dielectric layer 212. In some embodiments, the gate electrode layer 214 may comprise a single layer or multilayer structure. In the present embodiment, the gate electrode layer 214 may comprise poly-silicon. Further, the gate electrode layer 214 may be doped poly-silicon with the same or different doping. In one embodiment, the gate electrode layer 214 comprises a thickness in the range of about 30 nm to about 60 nm. The gate electrode layer 214 may be formed using a suitable process such as low-pressure chemical vapor deposition (LPCVD) or plasma enhanced chemical vapor deposition (PECVD), or combinations thereof.

Next, a hard mask layer 216 is formed over the blanket gate electrode layer 214 and a patterned photo-sensitive layer (not shown) is formed on the hard mask layer 216. The pattern of the photo-sensitive layer is transferred to the hard mask layer 216 and then transferred to the gate electrode layer 214 and gate dielectric layer 212 to form gate stacks 210a, 210b, and 210c over the major surface 202s of the substrate 202. The hard mask layer 216 comprises silicon oxide. Alternatively, the hard mask layer 216 may optionally comprise silicon nitride, silicon oxynitride, and/or other suitable dielectric materials, and may be formed using a method such as CVD or PVD. The hard mask layer 216 comprises a thickness in the range from about 100 to 800 Å. The photo-sensitive layer is stripped thereafter.

A conformal spacer material is then deposited around each of the gate stacks 210a, 210b, and 210c. In the present embodiment, the spacer material may include silicon oxide, silicon nitride, silicon oxy-nitride, or other suitable material. The spacer material may comprise a single layer or multilayer structure. A blanket layer of the spacer material may be formed by CVD, PVD, ALD, or other suitable technique. Then, an anisotropic etching is performed on the spacer material to form a spacer array 218. In the present embodiment, the spacer array 218 adjoining sidewalls 210s, 210w of the gate stack 210a over the substrate 202 is referred to as a pair of spacers 218a, 218b. The spacer 218a comprises a bottom surface 218s having an outer point 218p that is the point on the bottom surface 218s farthest from the gate stack 210a. The dielectric layer comprises a thickness ranging from about 5 to 15 nm. Further, the isolation structure 206a in the substrate 202 on one side of the gate stack 210a has the outer edge 206e closest to the spacer 218a.

Figure 3:
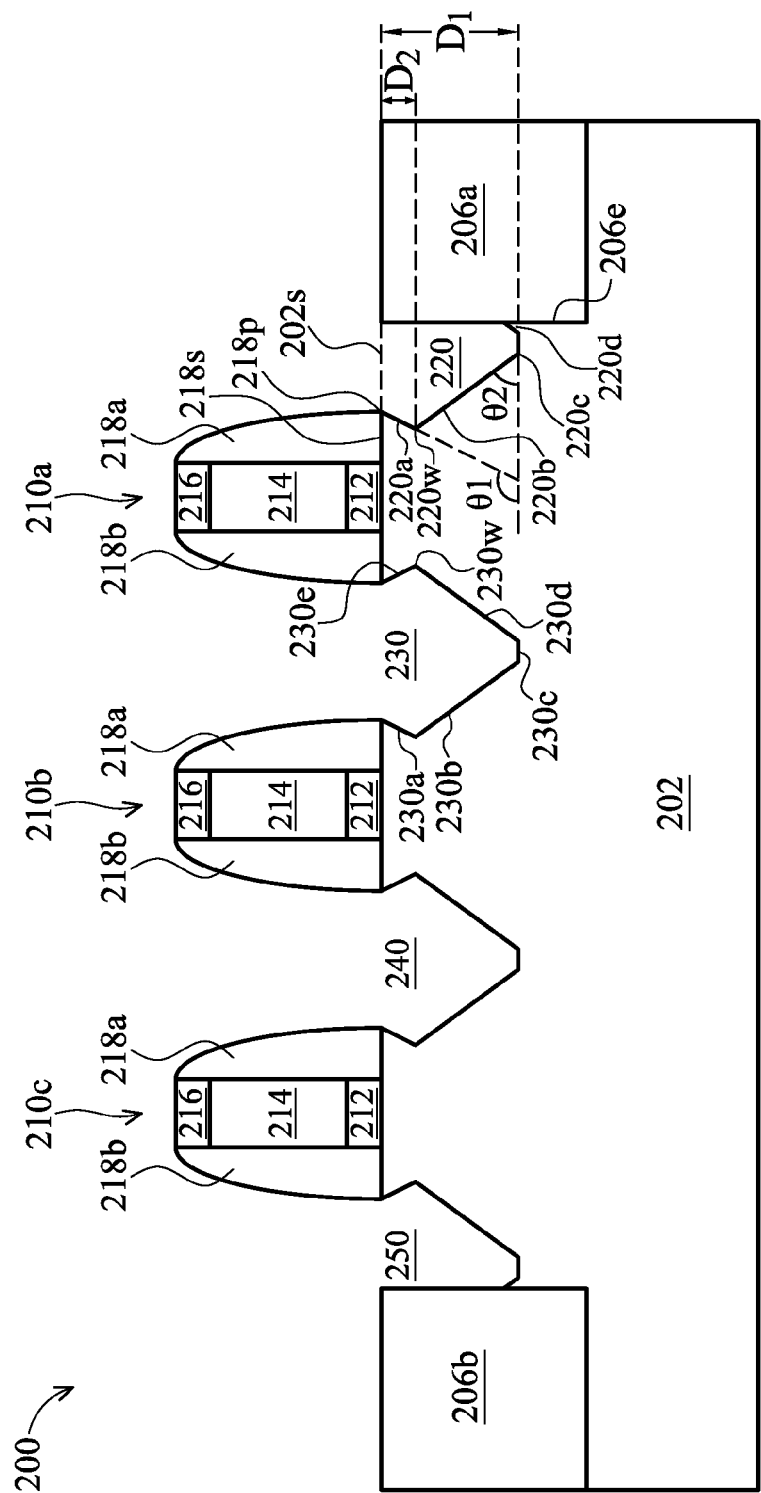

Referring to FIGS. 1 and 3, the method 100 continues with step 106 in which the substrate 202 is recessed to form source and drain (S/D) recess cavities 220, 230, 240, and 250 adjacent to the gate stacks 210a, 210b, and 210c in the substrate 202. In the structure of FIG. 3, formation of the S/D recess cavities 220, 230, 240, and 250 may be started using a biased dry etching process, followed by a non-biased wet or dry etching process.

In the present embodiment, the substrate 202 is a so-called (001) substrate having a major surface 202s. Using the spacer array 218 and isolation structures 206a, 206b as hard masks, the biased dry etching process is performed to recess the major surface 202s of the substrate 202 that are unprotected or exposed to form source and drain (S/D) recess regions (not shown), wherein the S/D recess regions may comprise a bottom surface parallel to the major surface 202s of the substrate 202 and sidewalls perpendicularly to the major surface 202s of the substrate 202. In an embodiment, the biased dry etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or Cl2 as etch gases. Also, in the embodiments provided, the bias voltage used in the biased dry etching process may be tuned to allow better control of an etching direction to achieve desired profiles for the S/D recess regions.

Then, applying a wet etching process to the source and drain (S/D) recess regions using hydration tetramethyl ammonium (TMAH), the perpendicular sidewalls of the S/D recess regions are changed to a slope formed of (111) crystal plane of the substrate 202 to form the S/D recess cavities 220, 230, 240, and 250.

As a result of such etching processes, there may be formed a plurality of facets formed of the (111) crystal plane in each S/D recess cavities 220, 230, 240, and 250. It should be noted that periphery environment with or without an etch stop can influence resulted features of the S/D recess cavities 220, 230, 240, and 250. As one example, the S/D recess cavity 220 between the gate stack 210a and isolation structure 206a have respective sidewall surfaces each defined by a bottom surface 220c and facets 220a, 220b, and 220d due to the isolation structure 206a acting as an etch stop. Thereby, the facet 220a and facet 220b thus formed intersect to each other and define together a wedge 220w in the S/D recess cavity 220, such that the wedge-shaped S/D recess cavity 220 invades in the substrate 202 into the region right underneath the spacer 218a toward the channel region. As another example, the S/D recess cavity 230 between the adjacent gate stacks 210a, 210b without an etch stop have respective sidewall surfaces each defined by a bottom surface 230c and facets 230a, 230b, 230d, and 230e. Thereby, the facet 230d and facet 230e thus formed intersect to each other and define together a wedge 230w in the S/D recess cavity 230, such that the wedge-shaped S/D recess cavity 230 invades in the substrate 202 into the region right underneath the spacer 218b toward the channel region.

In the illustrated example, the bottom surface 220c is formed of (100) crystal plane of the substrate 202 parallel to the major surface 202s of the substrate 202, while the facet 220a forms an angle $\theta_1$ to the bottom surface 220c. Further, the facets 220b form a smaller angle $\theta_2$ than the angle $\theta_1$ with respect to the bottom surface 220c. In the structure of FIG. 3, the angle $\theta_1$ takes the range of 90-150 degrees, while the angle $\theta_2$ takes the range of 40-60 degrees. In this case, too, the angles take the values of 146 degrees and 56 degrees respectively in the case the facets 220a, 220b are formed by the (111) crystal plane of the substrate 202. However, it should be noted that the structure of FIG. 3 is not limited in the case in which the facets 220a, 220b are formed by the (111) crystal plane.

Further, the bottom surface 220c is formed at a depth $D_1$ as measured from the major surface 202s of the substrate 202, while the facet 220a is formed down to a depth $D_2$. In the structure of FIG. 3, the depth $D_1$ is the range of 20 to 70 nm, while the depth $D_2$ is the range of 5 to 60 nm. By optimizing the depth $D_2$ and a distance between the mutually opposing wedges 220w, 230w, it becomes possible to confine the uniaxial compressive stress of a strained material 222 (shown in FIGS. 5A and 5B) to the channel region effectively, thereby enhancing the device performance.

The process steps up to this point have provided the substrate 202 having the S/D recess cavities 220, 230, 240, 250 adjacent to the gate stacks 210a, 210b, and 210c. Referring to FIGS. 1, 4, 5A and 5B, the method 100 continues with step 108 in which a strained material 222 is selectively grown in the S/D recess cavities 220, 230, 240, 250 in the substrate 202 using an LPCVD process. Because the lattice constant of the strained material 222 is different from the substrate 202, the channel region of the semiconductor device 200 is strained or stressed to enable carrier mobility of the device and enhance the device performance.

In the present embodiment, a pre-cleaning process may be performed to clean the S/D recess cavities 220, 230, 240, 250 with hydrofluoric acid (HF) or other suitable solution. Then, a lower portion 222l of a strained material 222 such as silicon germanium (SiGe) is selectively grown by an LPCVD process to partially fill the S/D recess cavities 220, 230, 240, 250 in the substrate 202. In one embodiment, the LPCVD process is performed at a temperature of about 400 to 800° C. and under a pressure of about 1 to 15 Torr, using $SiH_2Cl_2$, HCl, $GeH_4$, $B_2H_6$, and $H_2$ as reaction gases, wherein a ratio of a mass flow rate of the $SiH_2Cl_2$ to a mass flow rate of the HCl is in the range of about 0.45 to 0.55. Thermodynamically, growth rate of the close-packed (111) crystal plane of the strained material 222 is much greater than growth rates of other crystal planes of the strained material 222. In one embodiment, the strained material 222 is therefore grown from the facets 230a, 230b, 230d, and 230e to center of the S/D recess cavities 230 in the substrate 202. In another embodiment, the strained material 222 is therefore grown from the facets 220a, 220b, and 220d to center of the S/D recess cavities 220 in the substrate 202.

Basically, a dielectric material with an amorphous structure fails to offer homogeneous nucleation sites to grow an epitaxial material. In the present embodiment, both the spacer 218a and the isolation structure 206a are dielectric materials, so that the growth of the strained material 222 in the S/D recess cavity 220 will terminate while a (111) crystal plane of the strained material 222 intersects the outer point 218p at the bottom surface 218s of the spacer 218a and extend downward to the isolation structure 206a. However, further growth of the strained material 222 in the S/D recess cavity 230 occurs at the same time if the LPCVD process continues.

Figure 4:
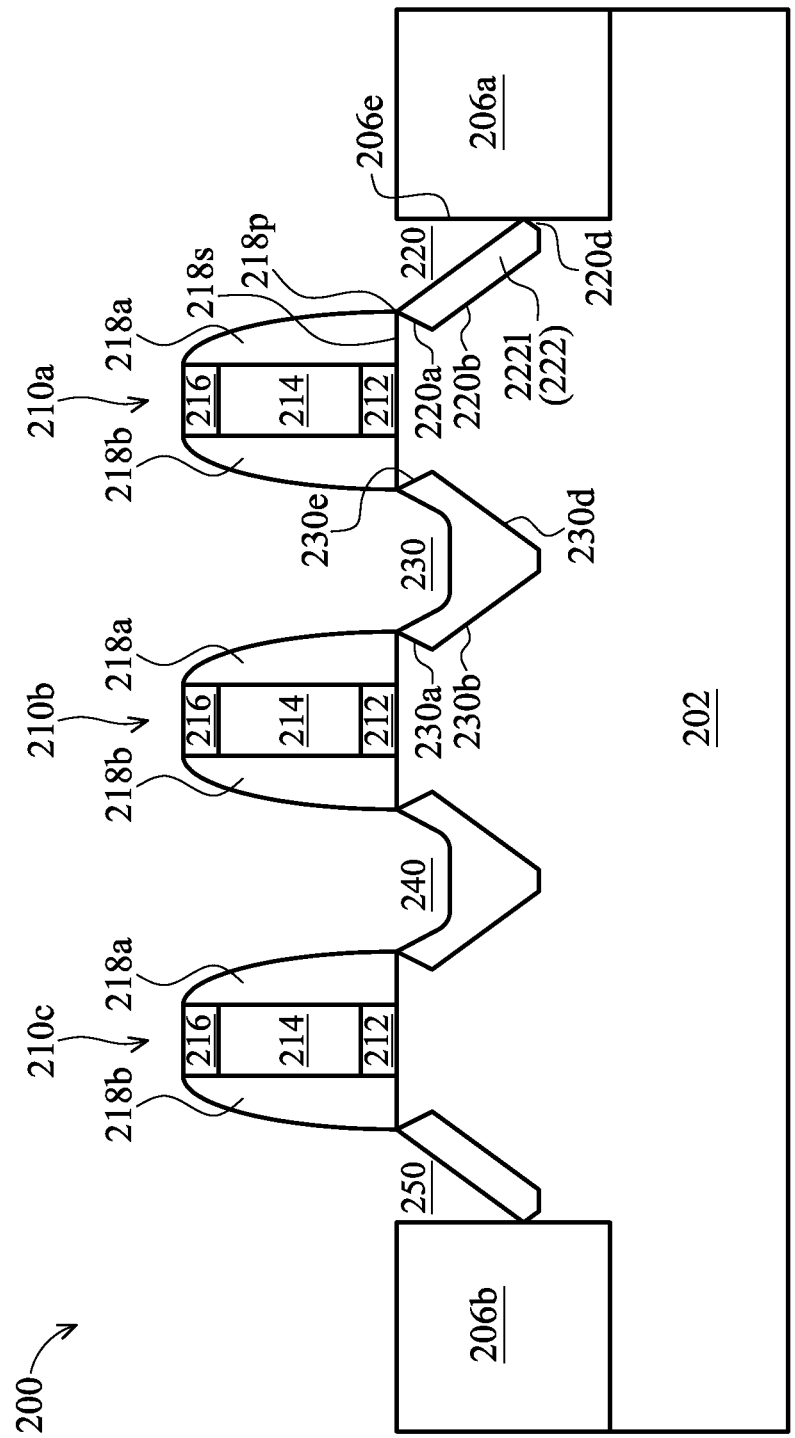

It can be seen in FIG. 4 that the lower portion 222l of the strained material 222 in the S/D recess cavity 220 occupies a small portion of the S/D recess cavity 220 and thus can not deliver a given amount of strain into channel region of the semiconductor device 200, thereby increasing the likelihood of device instability and/or device failure. A method to overcome growth energy barrier of the strained material 222 in the S/D recess cavity 220 for further growth of the strained material 222 in the S/D recess cavity 220 is hereafter provided according to various aspects of the present disclosure.

In the present embodiment, the LPCVD process is then changed and performed at a temperature of about 660 to 700° C. and under a pressure of about 13 to 50 Torr, using $SiH_2Cl_2$, HCl, $GeH_4$, $B_2H_6$, and $H_2$ as reaction gases, to form an upper portion 222u of the strained material 222, wherein a ratio of a mass flow rate of the $SiH_2Cl_2$ to a mass flow rate of the $GeH_4$ is in the range of about 10 to 50, and a ratio of a mass flow rate of the $SiH_2Cl_2$ to a mass flow rate of the HCl is in the range of about 0.8 to 1.5. Because less HCl mass flow rate at this step providing less etching chemical during selectively epitaxial process makes isotropic growth of the upper portion 222u of the strained material 222 easier, other crystal planes except the close-packed (111) crystal plane have more opportunity to appear to form the upper portion 222u (shown in FIG. 5A). In another embodiment, the growth step of the lower portion 222l of the strained material 222 can be replaced by this growth step. In other words, the strained material 222 can be formed using one growth step. Accordingly, the disclosed method of fabricating a semiconductor device 200 may fabricate a large-volume strained structure to enhance carrier mobility and upgrade the device performance.

In summary, the strained material 222 below the major surface 202s of the substrate 202 disposed between the spacer 218a and the isolation structure 206a comprises the upper portion 222u and the lower portion 222l separated by a transition plane 222p at an acute angle $\theta_3$ to the major surface 202s of the substrate 202, wherein the transition plane 222p intersects the outer point 218p and extends downward to the outer edge 206e of the isolation structure 206a, wherein the upper portion 222u comprises a first facet 222a adjacent to the spacer 218a (shown in FIG. 5A). In one embodiment, the acute angle $\theta_3$ takes the range of 50-60 degrees. In another embodiment, the acute angle $\theta_3$ is at the range of 53-59 degrees. In the present embodiment, the acute angle $\theta_3$ is 56 degrees and the transition plane 222p is defined by the (111) crystal plane of the strained material 222.

It is observed that an acute angle $\theta_4$ of the first facet 222a to the major surface 202s of the substrate 202 is less than the acute angle $\theta_3$ of the transition plane 222p to the major surface 202s of the substrate 202. In one embodiment, the first facet 222a is defined by the (311) crystal plane of the strained material 222. In the present embodiment, the upper portion 222u further comprises a second facet 222b separated from the spacer 218a by the first facet 222a, wherein the acute angle $\theta_4$ of the first facet to the major surface 202s of the substrate 202 is less than an acute angle $\theta_5$ of the second facet 222b to the major surface 202s of the substrate 202. In one embodiment, the second facet 222b is defined by the (111) crystal plane of the strained material 222. Further, the first facet 222a and second facet 222b are planar surfaces. However, it should be noted that the structure of FIG. 5A is not limited in the case in which the additional facets of the strained material 222 may also be formed due to isotropic growth of the upper portion 222u.

Further, a cross-sectional area of the lower portion 222l is greater than a cross-sectional area of the upper portion 222u. In some embodiments, this is enough to deliver a given amount of strain into channel region of the semiconductor device 200. Accordingly, the disclosed method of fabricating a semiconductor device 200 may fabricate a strained structure to enhance carrier mobility and upgrade the device performance.

In some embodiments, further growth of the upper portion 222u of the strained material 222 until the cross-sectional area of the lower portion 222l less than a cross-sectional area of the upper portion 222u (shown in FIG. 5B) is desired to deliver a given amount of strain into channel region of the semiconductor device 200.

In some embodiments, selective growth of an additional strained material 232 in the S/D recess cavity 230 separated from the strained material 222 in the S/D recess cavity 220 by the gate stack 210a is not confined by the isolation structure 206a, growth rate of the additional strained material 232 is thus greater than the growth rate of the strained material 222 in the S/D recess cavity 220. Because both the materials 222, 232 are grown simultaneously, a cross-sectional area of the additional strained material 232 is greater than a cross-sectional area of the strained material 222.

In one embodiment, the selective growth of the additional strained material 232 is terminated while the material 232 is a distance ranging from about 10 to 100 nm below the surface 202a of the substrate 202 (not shown). In another embodiment, the selective growth of the additional strained material 232 continues until the material 232 extends a distance ranging from about 10 to 100 nm above the major surface 202a of the substrate 202. Further growth of the additional strained material 232 may occupy space required by low-resistance silicide formed on the material 232, thereby increasing short opportunity between adjacent devices. Therefore, the strained material 222 on the structure of FIG. 5B is limited below the major surface 202s of the substrate 202 disposed between the spacer 218a and the isolation structure 206a due to confined growth of the additional strained material 232.

In summary, the strained material 222 below the major surface 202s of the substrate 202 disposed between the spacer 218a and the isolation structure 206a comprises the upper portion 222u and the lower portion 222l separated by a transition plane 222p at an acute angle $\theta_3$ to the major surface 202s of the substrate 202, wherein the transition plane 222p intersects the outer point 218p and extends downward to the outer edge 206e of the isolation structure 206a, wherein the upper portion 222u comprises a first facet 222a adjacent to the spacer 218a (shown in FIG. 5B). In one embodiment, the acute angle $\theta_3$ takes the range of 50-60 degrees. In another embodiment, the acute angle $\theta_3$ is at the range of 53-59 degrees. In the present embodiment, the acute angle $\theta_3$ is 56 degrees and the transition plane 222p is defined by the (111) crystal plane of the strained material 222.

An acute angle $\theta_4$ of the first facet 222a to the major surface 202s of the substrate 202 is less than the acute angle $\theta_3$ of the transition plane 222p to the major surface 202s of the substrate 202. In one embodiment, the first facet is defined by the (311) crystal plane of the strained material 222. In the present embodiment, the upper portion 222u further comprises a second facet 222b separated from the spacer 218a by the first facet 222a, wherein the acute angle $\theta_4$ of the first facet to the major surface 202s of the substrate 202 is less than an acute angle $\theta_5$ of the second facet 222b to the major surface 202s of the substrate 202. In one embodiment, the second facet 222b is defined by the (111) crystal plane of the strained material 222. Further, the first facet 222a and second facet 222b are planar surfaces. However, it should be noted that the structure of FIG. 5B is not limited in the case in which the additional facets of the strained material 222 may also be formed due to isotropic growth of the upper portion 222u. Accordingly, the disclosed method of fabricating a semiconductor device 200 may fabricate a strained structure to enhance carrier mobility and upgrade the device performance.

Figure 5A:
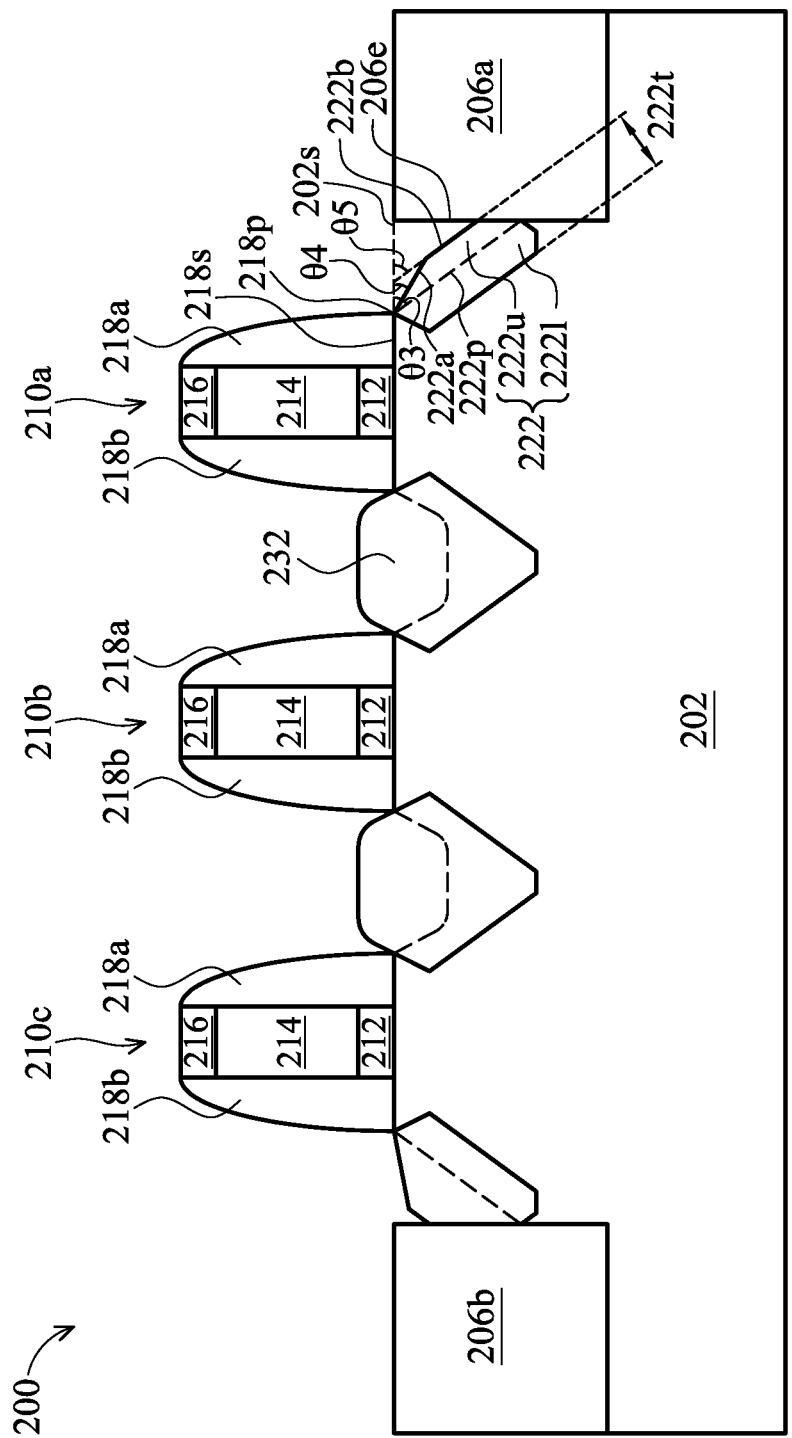
Figure 5B:
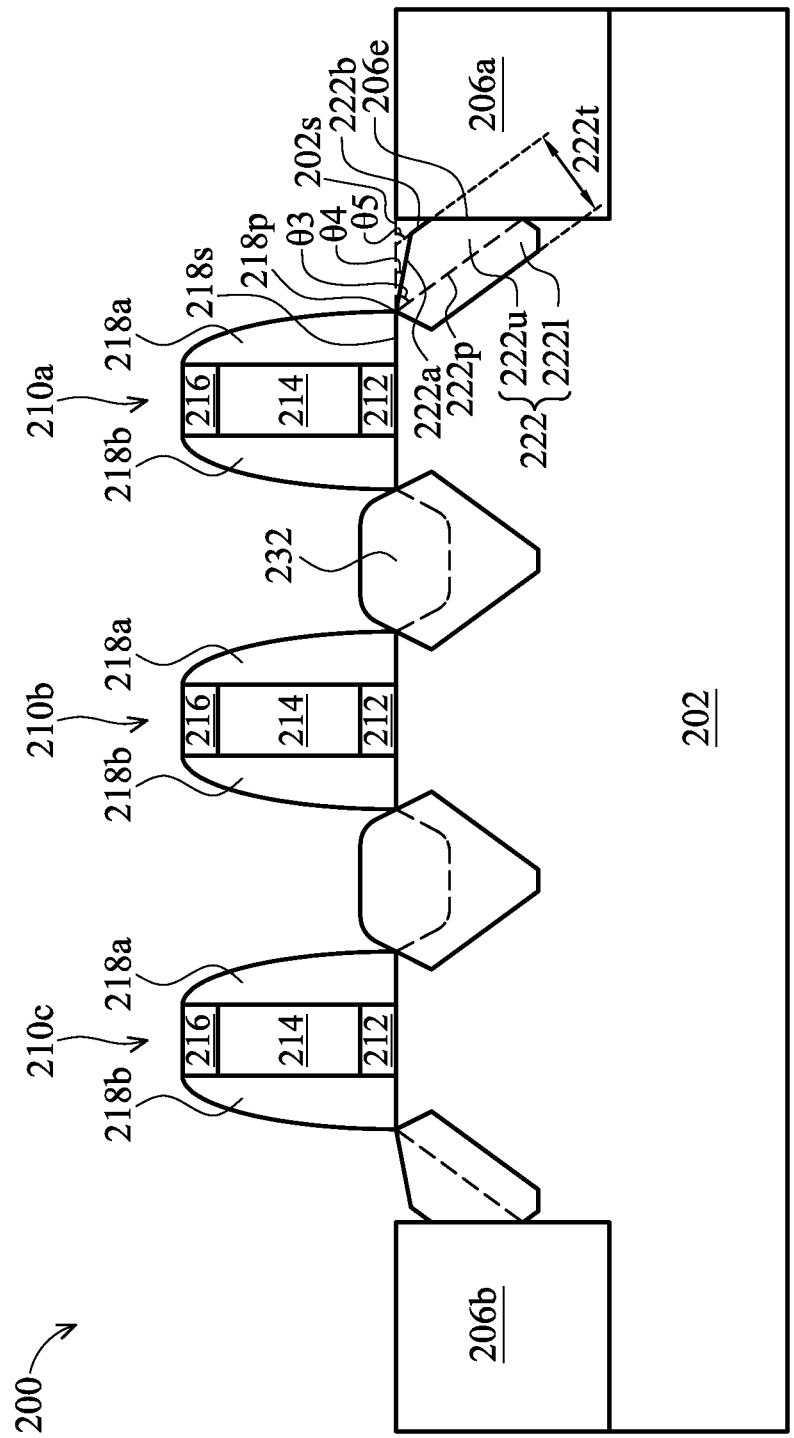

Further, a maximum thickness 222t of the strained material 222 on the structure of FIGS. 5A and 5B is in the range of about 20 to 300 nm. The strained material 222 comprises SiGe having a Ge concentration in the range of about 10% to 40% in terms of atomic percent.

It is understood that the semiconductor device 200 may undergo further CMOS processes to form various features such as contacts/vias, interconnect metal layers, dielectric layers, passivation layers, etc. In some embodiment, the gate stacks 210a, 210b, 210c may be dummy gate stacks. Thus, the CMOS processes further comprise a "gate last" process to replace the poly-silicon gate electrode with a metal gate electrode to improve device performance. In one embodiment, the metal gate electrode may include a metal such as Al, Cu, W, Ti, Ta, TiN, TiAl, TiAlN, TaN, NiSi, CoSi, other suitable conductive materials, or combinations thereof. It has been observed that the modified strained structure provides a given amount of strain into channel region of a semiconductor device, thereby enhancing the device performance.

One aspect of this description relates to a method for fabricating a semiconductor device including forming a gate stack over a major surface of a substrate. The method further includes recessing the substrate to form source and drain recess cavities adjacent to the gate stack in the substrate. The method further includes selectively growing a strained material in the source and drain recess cavities in the substrate using an LPCVD process, wherein the LPCVD process is performed at a temperature of about 660 to 700° C. and under a pressure of about 13 to 50 Torr, using $SiH_2Cl_2$, HCl, $GeH_4$, $B_2H_6$, and $H_2$ as reaction gases.

Another aspect of this description relates to a method for fabricating a semiconductor device. The method includes recessing the substrate to form source and drain recess cavities. Recessing the substrate includes drying etching the substrate using a biased dry etching process, and wet etching the dry etches substrate to form sidewalls of the source and drain recess cavities in a (111) crystal plane of the substrate. The method further includes selectively growing a strained material in the source and drain recess cavities in the substrate using an LPCVD process, wherein the LPCVD process is performed at a temperature of from about 660 to 700° C. and under a pressure of from about 13 to 50 Torr, using $SiH_2Cl_2$, HCl, $GeH_4$, $B_2H_6$, and $H_2$ as reaction gases.

Still another aspect of this description relates to a method for fabricating a semiconductor device. The method includes recessing the substrate to form source and drain recess cavities. Recessing the substrate includes forming an upper portion having a first angle between a line parallel to a sidewall of the upper portion and a line parallel to a bottom surface of the at least one of the source and drain recess cavities. Recessing the substrate further includes forming a lower portion, wherein the upper portion is located closer to a top surface of the substrate than the lower portion, the lower portion having a second angle between a line parallel to a sidewall of the lower portion and the line parallel to the bottom surface of the at least one of the source and drain recess cavities, the second angle different from the first angle. The method further includes selectively growing a strained material in the source and drain recess cavities in the substrate using an LPCVD process, wherein the LPCVD process is performed at a temperature of from about 660 to 700° C. and under a pressure of from about 13 to 50 Torr, using $SiH_2Cl_2$, HCl, $GeH_4$, $B_2H_6$, and $H_2$ as reaction gases.

While the disclosure has described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a semiconductor device, comprising:
   forming a gate stack over a major surface of a substrate;
   recessing the substrate to form source and drain recess cavities adjacent to the gate stack in the substrate; and
   selectively growing a strained material in the source and drain recess cavities in the substrate using a low-pressure chemical vapor deposition (LPCVD) process, wherein the LPCVD process is performed using $SiH_2Cl_2$, HCl, $GeH_4$, $B_2H_6$, and $H_2$ as reaction gases, wherein a ratio of a mass flow rate of the $SiH_2Cl_2$ to a mass flow rate of the $GeH_4$ is in the range of from about 10 to 50, and the LPCVD process is performed at a temperature of from about 660 to 700° C. and under a pressure of from about 13 to 50 Torr.

2. The method of claim 1, wherein the gate stack comprises at least one of a poly-silicon gate electrode or a metal gate electrode.

3. The method of claim 1, wherein the growth of the strained material is terminated before a top surface of the strained material grows above the major surface of the substrate.

4. The method of claim 1, wherein the growth of the strained material continues until a top surface of the strained material extends above the major surface of the substrate in one of the source and drain recess cavities.

5. The method of claim 1, wherein a ratio of a mass flow rate of the $SiH_2Cl_2$ to a mass flow rate of the HCl is in the range of from about 0.8 to 1.5.

6. The method of claim 1, wherein the strained material comprises SiGe comprising a Ge concentration in the range of from about 10% to 40% in terms of atomic percent.

7. The method of claim 1, wherein recessing the substrate comprises performing a biased dry etching, wherein the biased dry etching is performed at a bias voltage ranging from about 20 volts (V) to about 500 V.

8. The method of claim 7, wherein recessing the substrate further comprises performing a wet etching process to define a slope of the source and drain recess cavities along a (111) crystal plane of the substrate.

9. The method of claim 1, wherein recessing the substrate comprises forming at least one of the source and drain recess cavities having an upper portion and a lower portion, wherein the upper portion is located closer to a top surface of the substrate than the lower portion, and
   a first angle between a line parallel to a sidewall of the upper portion and a line parallel to a bottom surface of the at least one of the source and drain recess cavities is different from a second angle between a line parallel to a sidewall of the lower portion and the line parallel to the bottom surface of the at least one of the source and drain recess cavities.

10. The method of claim 9, wherein recessing the substrate further comprises forming the first angle in a range of about 90-degrees to about 150-degrees.

11. The method of claim 9, wherein recessing the substrate further comprises forming the second angle in a range of about 40-degrees to about 60-degrees.

12. The method of claim 1, wherein selectively growing the strained material comprises:
   forming a first angle between a first surface of the strained material in at least one of the source and drain cavities and a line parallel to a top surface of the substrate; and
   forming a second angle between a second surface of the strained material in the at least one of the source and drain cavities and the line parallel to the top surface of the substrate,
   wherein the first angle is different from the second angle.

13. The method of claim 1, wherein selectively growing the strained material comprises selectively growing the strained material to a height above a top surface of the substrate, wherein the height ranges from about 10 nanometers (nm) to about 100 nm.

14. The method of claim 1, wherein selectively growing the strained material comprises selectively growing the strained material to a thickness ranging from about 20 nanometers (nm) to about 300 nm.

15. The method of claim 1, further comprising forming an isolation structure in the substrate, wherein recessing the substrate comprises recessing the substrate between the gate stack and the isolation structure.

16. The method of claim 15, wherein selectively growing the strained material between the isolation structure and the gate stack comprises selectively growing the strained material having a top surface below a top surface of the substrate.

17. A method for fabricating a semiconductor device, comprising:
   recessing the substrate to form source and drain recess cavities, wherein recessing the substrate comprises:
      dry etching the substrate using a biased dry etching process, and
      wet etching the dry etched substrate to form sidewalls of the source and drain recess cavities in a crystal plane of the substrate; and
   selectively growing a strained material in the source and drain recess cavities in the substrate using a low-pressure chemical vapor deposition (LPCVD) process, wherein the LPCVD process is performed using $SiH_2Cl_2$, HCl, $GeH_4$, $B_2H_6$, and $H_2$ as reaction gases, wherein a ratio of a mass flow rate of the $SiH_2Cl_2$ to a mass flow rate of the $GeH_4$ is in the range of from about 10 to 50, and the LPCVD process is performed at a temperature of from about 660 to 700° C. and under a pressure of from about 13 to 50 Torr.

18. The method of claim 17, wherein a ratio of a mass flow rate of the $SiH_2Cl_2$ to a mass flow rate of the HCl is in the range of from about 0.8 to 1.5.

19. A method for fabricating a semiconductor device, comprising:
   recessing the substrate to form source and drain recess cavities, wherein recessing the substrate comprises:
      forming an upper portion having a first angle between a line parallel to a sidewall of the upper portion and a line parallel to a bottom surface of the at least one of the source and drain recess cavities, and
      forming a lower portion, wherein the upper portion is located closer to a top surface of the substrate than the lower portion, the lower portion having a second angle between a line parallel to a sidewall of the lower portion and the line parallel to the bottom surface of the at least one of the source and drain recess cavities, the second angle different from the first angle; and
   selectively growing a strained material in the source and drain recess cavities in the substrate using a low-pressure chemical vapor deposition (LPCVD) process, wherein the LPCVD process is performed at a temperature of from about 660 to 700° C. and under a pressure of from about 13 to 50 Torr, using $SiH_2Cl_2$, HCl, $GeH_4$, $B_2H_6$, and $H_2$ as reaction gases, wherein a ratio of a mass flow rate of the $SiH_2Cl_2$ to a mass flow rate of the $GeH_4$ is in the range of from about 10 to 50.

20. The method of claim 19, wherein a ratio of a mass flow rate of the $SiH_2Cl_2$ to a mass flow rate of the HCl is in the range of from about 0.8 to 1.5.

* * * * *